(12) United States Patent
Van Sloten et al.

(10) Patent No.: US 11,569,728 B1
(45) Date of Patent: Jan. 31, 2023

(54) ERROR DETECTION FOR POWER CONVERTER

(71) Applicant: Infineon Technologies AG, Neubiberg (DE)

(72) Inventors: Winand Van Sloten, Padua (IT); Filippo Boera, Morbegno (IT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/456,848

(22) Filed: Nov. 29, 2021

(51) Int. Cl.
| | | |
|---|---|---|
| *H02M 1/08* | (2006.01) | |
| *H03K 3/037* | (2006.01) | |
| *G06F 1/06* | (2006.01) | |
| *G06F 1/08* | (2006.01) | |
| *H03K 5/01* | (2006.01) | |
| *H03K 5/00* | (2006.01) | |

(52) U.S. Cl.
CPC ............... *H02M 1/08* (2013.01); *G06F 1/06* (2013.01); *G06F 1/08* (2013.01); *H03K 3/037* (2013.01); *H03K 5/01* (2013.01); *H03K 2005/00013* (2013.01)

(58) Field of Classification Search
None
See application file for complete search history.

(56) References Cited

U.S. PATENT DOCUMENTS

| | | | |
|---|---|---|---|
| 10,418,902 B1* | 9/2019 | Dharmalinggam | H02M 1/08 |
| 2019/0326757 A1* | 10/2019 | Yao | H02M 1/08 |
| 2021/0159789 A1* | 5/2021 | Hsu | H02M 3/158 |
| 2022/0066980 A1* | 3/2022 | Khamesra | G06F 1/08 |

OTHER PUBLICATIONS

Rusbehani et al., "Use of a Nonlinear Controller to Improve One-cycle Controller Response", Journal of Applied Sciences, vol. 6, 2006, 9 pp. (Applicant points out, in accordance with MPEP 609.04(a), that the year of publication, 2006, is sufficiently earlier than he effective U.S. filing date, so that the particular month of publication is not in issue.).

* cited by examiner

*Primary Examiner* — Cassandra F Cox
(74) *Attorney, Agent, or Firm* — Shumaker & Sieffert, P.A.

(57) ABSTRACT

A circuit for controlling a switch of a power converter includes a first clock signal generator configured to generate a first clock signal and a switching signal generator configured to generate a switching signal to control the switch of the power converter based on the first clock signal. The circuit further includes error detection circuitry configured to output an error indication and a second clock signal generator configured to generate, in response to the error indication, a second clock signal that comprises an edge of a clock cycle of the second clock signal that corresponds to when the switching signal deactivates the switch of the power converter plus a time delay. The switching signal generator is configured to generate the switching signal to control the switch of the power converter further based on the second clock signal in response to the error indication being output by the error detection circuitry.

20 Claims, 7 Drawing Sheets

ERROR DETECTION FOR POWER CONVERTER

TECHNICAL FIELD

This disclosure relates to circuits and techniques for generating a switching signal, and more specifically, circuits and techniques for generating a switching signal associated with operating a power converter.

BACKGROUND

A driver circuit may generate a switching signal to control an operation of a power converter. The driver circuit may control a voltage, current, and/or power output by the power converter using a duty cycle of the switching signal. For example, the driver circuit may generate the switching signal with a duty cycle to regulate a voltage output by a Buck converter.

SUMMARY

In general, this disclosure is directed to techniques for operating a power converter in a constant off-time switching mode when the power converter operates in an unintended equilibrium, such as a operating the power converter at half a target frequency. For example, a switching signal generator of a driver circuit may generate, in response to an error indication, a switching signal based on a second clock signal that includes an edge of a clock cycle that corresponds to when the switching signal deactivates the switch of the power converter plus a time delay.

In one example, this disclosure describes a circuit for controlling a switch of a power converter that includes a first clock signal generator configured to generate a first clock signal and a switching signal generator configured to generate a switching signal to control the switch of the power converter based on the first clock signal. The circuit further includes error detection circuitry configured to output an error indication in response to the switching signal activating the switch of the power converter during an edge of a current clock cycle of the first clock signal and a second clock signal generator configured to generate, in response to the error indication being output by the error detection circuitry, a second clock signal that comprises an edge of a clock cycle of the second clock signal that corresponds to when the switching signal deactivates the switch of the power converter plus a time delay. The switching signal generator is configured to generate the switching signal to control the switch of the power converter further based on the second clock signal in response to the error indication being output by the error detection circuitry.

In another example, this disclosure describes a method for controlling a switch of a power converter. The method includes generating a first clock signal and generating a switching signal to control the switch of the power converter based on the first clock signal. The method further includes outputting an error indication when the switching signal activates the switch of the power converter during an edge of a current clock cycle of the first clock signal and generating, when the error indication is being output, a second clock signal that comprises an edge of a clock cycle of the second clock signal that corresponds to when the switching signal deactivates the switch of the power converter plus a time delay. The method further includes generating the switching signal to control the switch of the power converter further based on the second clock signal in response to the error indication being output.

In another example, this disclosure describes a system comprising a power converter and driver circuitry. The driver circuitry includes a first clock signal generator configured to generate a first clock signal and a switching signal generator configured to generate a switching signal to control a switch of the power converter based on the first signal. The driver circuitry further includes error detection circuitry configured to output an error indication in response to the switching signal activating the switch of the power converter during an edge of a current clock cycle of the first clock signal and a second clock signal generator configured to generate, in response to the error indication being output by the error detection circuitry, a second clock signal that comprises an edge of a clock cycle of the second clock signal that corresponds to when the switching signal deactivates the switch of the power converter plus a time delay. The switching signal generator is configured to generate the switching signal to control the switch of the power converter further based on the second clock signal in response to the error indication being output by the error detection circuitry.

Details of these and other examples are set forth in the accompanying drawings and the description below. Other features, objects, and advantages will be apparent from the description and drawings, and from the claims.

DETAILED DESCRIPTION

In general, this disclosure is directed to techniques for operating a power converter. For example, a driver circuit may control a power converter, such as a Buck converter, using one-cycle control ("OCC"). For instance, the driver circuit may operate (e.g., switch-in or switch-out) a switch of the power converter based on a reference voltage provided by an error-amplifier that monitors the power converter output. However, operating the switch based on the reference voltage provided by the error amplifier may result in the driver circuit getting "stuck" in an unintended equilibrium of switching frequency being, for example, half of an intended switching frequency due to a comparator reference being double than intended. When operating in the unintended equilibrium of switching frequency, the driver circuit may generate a switching signal with a regulator on-time and off-time being double the intended on-time and off-time, respectively, as well maintaining the intended duty-cycle. In some examples, the driver circuit may operate in the unintended equilibrium of switching frequency in response to a relatively large load step.

Some systems may configure a driver circuit to temporarily force a maximum comparator reference voltage limit or minimum comparator reference voltage limit, which is a voltage-domain solution. Such voltage-domain solutions may cause limit-cycles. Moreover, voltage-domain solutions may not be stable when the maximum or minimum comparator reference voltage limits are not properly designed and the system moves out of the limited range of stability. An example of a voltage-domain solution is described in Mohsen Rusbehani et al. in "Use of a Nonlinear Controller to Improve One-cycle Controller Response."

In accordance with the techniques of the disclosure, the driver circuit may be configured to operate, when the power converter operates in the unintended equilibrium of switching frequency, in a constant off-time switching mode to bring the power converter back into the intended equilibrium of switching frequency, which is a time-domain solution. In this way, the driver circuit may be configured to force and keep the power converter operating in a constant off-time switching mode for as long as the system uses a switching frequency lower than the intended one, where the constant off-time is the minimum off-time possible. For example, a switching signal generator may generate, in response to an error indication, a switching signal based on a second clock signal that includes an edge of a clock cycle that corresponds to when the switching signal deactivates the switch of the power converter plus a time delay.

Figure 1:
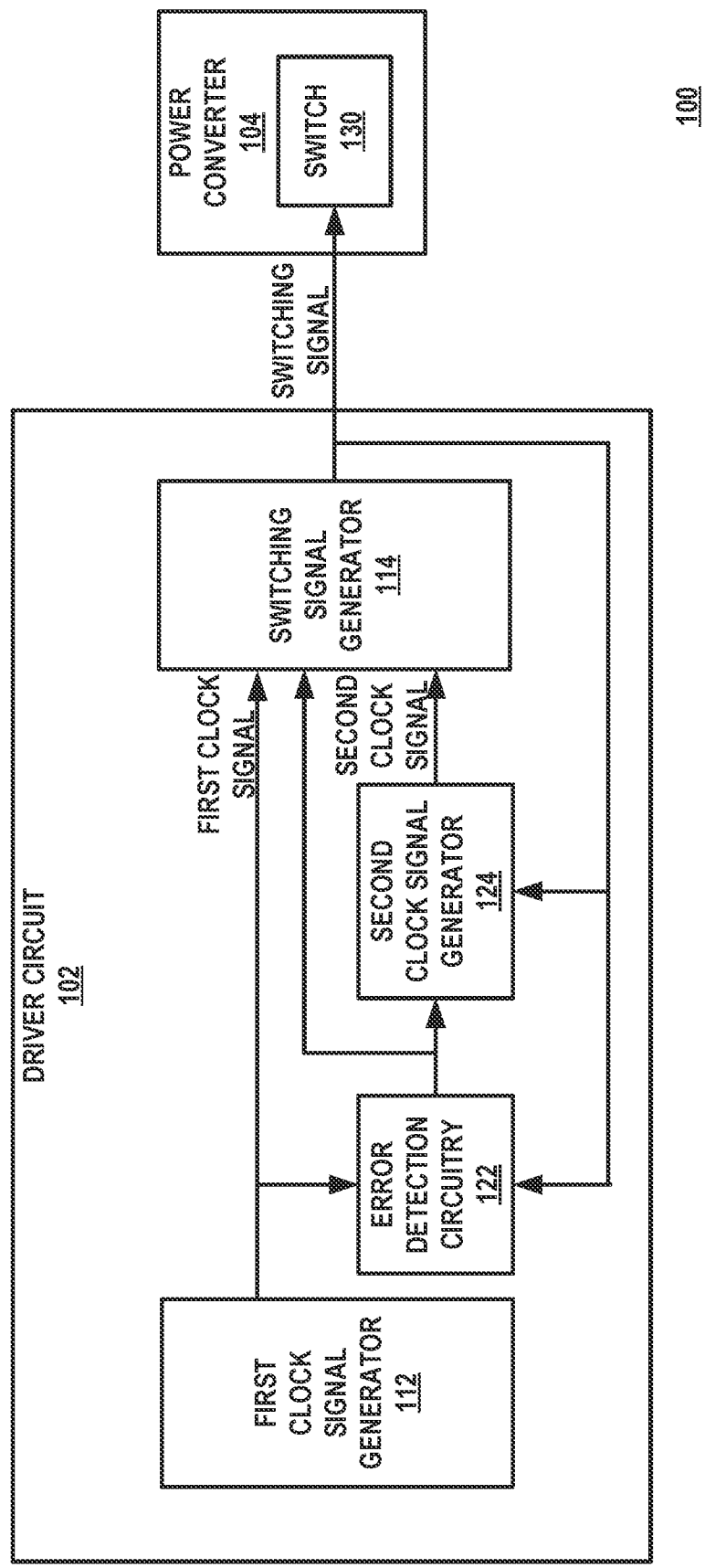
FIG. 1 is a block diagram illustrating an example system for controlling a power converter, in accordance with one or more techniques of this disclosure.

FIG. 1 is a block diagram illustrating an example system 100 for controlling a power converter 104, in accordance with one or more techniques of this disclosure. As illustrated in the example of FIG. 1, system 100 may include a driver circuit 102 and a power converter 104. Driver circuit 102 may include a first clock signal generator 112, error detection circuitry 122, a second clock signal generator 124, and a switching signal generator 114.

Power converter 104 may be configured to generate an output (e.g., an output voltage, an output current, or an output power) based on an operation of a switch 130 of power converter 104. Power converter 104 may include switch-mode power converters. Examples of switch-mode power converters may include, but are not limited to, flyback, buck-boost, buck, auk, or another switch-mode power converter. In some examples, power converter 104 may receive a voltage and output a voltage that is different from the received voltage. For instance, power converter 104 may receive a first voltage and output a second voltage that is less or greater than the first voltage. More specifically, in some examples, power converter 104 may include a Buck converter that bucks (e.g., reduces) the first voltage received from a voltage source.

Switch 130 may comprise a switching element. Examples of switching elements may include, but are not limited to, a silicon-controlled rectifier (SCR), a Field Effect Transistor (FET), and a bipolar junction transistor (BJT). Examples of FETs may include, but are not limited to, a junction field-effect transistor (JFET), a metal-oxide-semiconductor FET (MOSFET), a dual-gate MOSFET, an insulated-gate bipolar transistor (IGBT), any other type of FET, or any combination of the same. Examples of MOSFETS may include, but are not limited to, a depletion mode p-channel MOSFET (PMOS), an enhancement mode PMOS, depletion mode n-channel MOSFET (NMOS), an enhancement mode NMOS, a double-diffused MOSFET (DMOS), any other type of MOSFET, or any combination of the same. Examples of BJTs may include, but are not limited to, PNP, NPN, heterojunction, or any other type of BJT, or any combination of the same. It should be understood that switching elements may be high-side or low-side switching elements. Additionally, switching elements may be voltage-controlled and/or current-controlled. Examples of current-controlled switching elements may include, but are not limited to, gallium nitride (GaN) MOSFETs, BJTs, or other current-controlled elements.

Driver circuit 102 may be configured to control switch 130 of power converter 104. As shown, driver circuit 102 may directly control switch 130 using the switching signal. However, in some examples, a driver may be configured to drive switch 130 of power converter 104 based on the switching signal.

In accordance with the techniques of the disclosure, first clock signal generator 112 may be configured to generate a first clock signal. The first clock signal may be a synchronous clock signal. In this example, switching signal generator 114 may be configured to generate a switching signal to control the switch of the power converter based on the first clock signal. For example, when error detection circuitry 122 refrains from outputting an error indication and/or outputs an indication of normal operation, switching signal generator 114 may generate the switching signal to operate switch 130 based on the first clock signal generated by first clock signal generator 112.

Error detection circuitry 122 may be configured to output an error indication in response to the switching signal activating switch 130 of power converter 104 during an edge (e.g., a rising edge) of a current clock cycle of the first clock signal. For example, in response to power converter 104 operating in an unintended equilibrium of switching frequency being, for example, half of an intended switching frequency, error detection circuitry 122 may output the error indication.

Second clock signal generator 124 may be configured to generate, in response to the error indication being output by error detection circuitry 122, a second clock signal that comprises an edge of a clock cycle of the second clock signal that corresponds to when the switching signal deactivates switch 130 of power converter 104 plus a time delay. The second clock signal may include an asynchronous clock signal. The time delay may correspond to (e.g., equal to) a minimum off time for switch 130. In some examples, the time delay may be greater than the minimum off time for switch 130. The time delay may be programmable. In some examples, the edge of the of the clock signal of the second clock signal includes a rising edge.

Switching signal generator 114 may be configured to generate the switching signal to control switch 130 of power converter 104 further based on the second clock signal in response to the error indication being output by the error detection circuitry. In this way, driver circuit 102 may be configured to force and keep power converter 104 operating in a constant off-time switching mode for as long as system 100 uses a switching frequency lower than the intended one.

Figure 2:
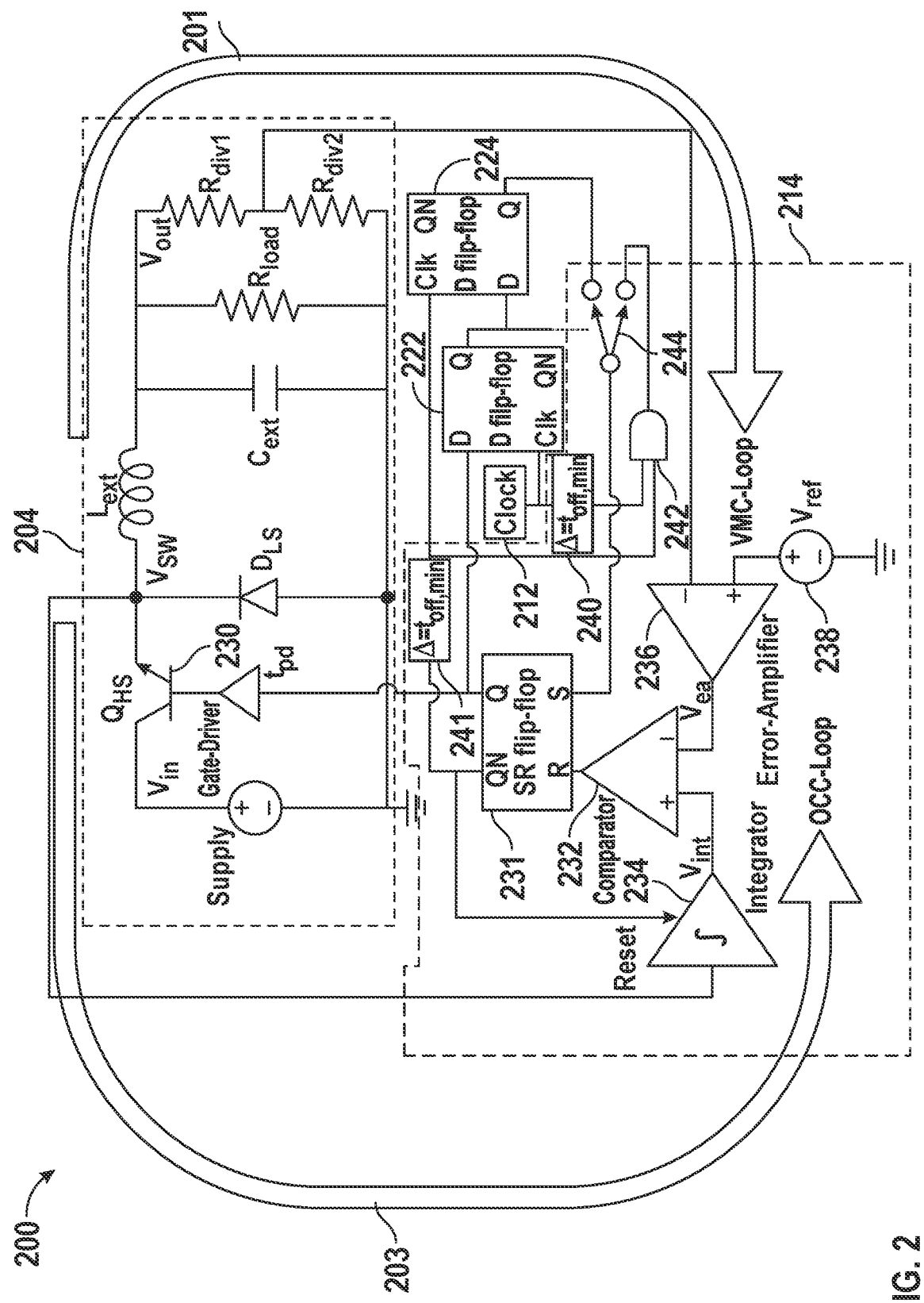
FIG. 2 is a conceptual diagram illustrating examples of a switching signal generator, a first clock signal generator, a second clock signal generator, and error detection circuitry, in accordance with one or more techniques of this disclosure.

FIG. 2 is a conceptual diagram illustrating examples of a switching signal generator 214, a first clock signal generator 212, a second clock signal generator 224, and D flip-flop 222, in accordance with one or more techniques of this disclosure. D flip-flop 222 may be an example of error detection circuitry 122 of FIG. 1.

In the example of FIG. 2, switching signal generator 214 includes a set-reset (SR) flip-flop 231 including a set (S) input configured to receive (e.g., from multiplexer 244) the second clock signal when D flip-flop 222 outputs the error indication and to receive, when D flip-flop 222 does not output the error indication, an indication of a setting state event. The setting state may be based on an AND operation (e.g., by AND gate 242) on the first clock signal delayed by the time delay (e.g., controlled by time delay unit 240) and an inverted signal of the switching signal delayed by the time delay (e.g., controlled by time delay unit 241). SR flip-flop 231 further includes a reset (R) input configured to receive an indication of whether to reset the switching signal that is based on a comparison (e.g., by comparator 232) of an indication of an integration (e.g., by integrator 234) of a switching voltage output at switch 230 of power converter 204 and an indication of a difference between a voltage output by power converter 204 (e.g., output by error amplifier 236) and a reference voltage (e.g., output by reference supply 238). SR flip-flop 231 further includes an output (Q) configured to output the switching signal.

Switching signal generator 214 may further include a multiplexer 244 that includes a first input configured to receive the second clock signal (e.g., output by SR flip-flop 231), a second input configured to receive the indication of the setting state event (e.g., output by AND gate 242), and a select line input configured to receive the error indication (e.g., output by D flip-flop 222).

Switching signal generator 214 may further include a comparator 232 that includes a first input configured to receive the indication of the integration of the switching voltage (e.g., from integrator 234), a second input configured to receive the indication of the difference between the voltage output by power converter 204 and the reference voltage (e.g., from error amplifier 236), and an output configured to output the indication of whether to reset the switching signal based on the comparison of the indication of the integration of the switching voltage and the indication of the difference between the voltage output by the power converter and the reference voltage.

Switching signal generator 214 may further include an error amplifier 236 that includes a first input configured to receive the indication of the voltage output by power converter 204, a second input configured to receive the reference voltage (e.g., from reference supply 238), and an output configured to output the indication of the difference between the voltage output by power converter 204 and the reference voltage.

Switching signal generator 214 may further include an integrator 234 that includes an input configured to receive an indication of a switching voltage output at the switch of power converter 204, a reset input configured to receive the inverted signal of the switching signal (e.g., from SR flip-flop 231) and an output configured to output the indication of the integration of the switching voltage.

D flip-flop 222 may include a delay input (D) configured to receive the switching signal (e.g., from SR flip-flop 231), a clock input (Clk) configured to receive the first clock signal (e.g., from first clock signal generator 212), and an output (Q) configured to output the error indication.

Second clock signal generator 224 may include a delay (D) flip-flop comprising a delay input (D) configured to receive the error indication (e.g., from D-flip flop 222), a clock input (Clk) configured to receive an inverted signal of the switching signal delayed by the time delay, and an output (Q) configured to output the second clock signal.

The voltage-mode control (VCM) loop 201 may provide the appropriate reference voltage $V_{ea}$ to comparator 232 by means of error-amplifier 236 which may amplify a difference between the reference voltage $V_{ref}$ and the divided output voltage $V_{out}$ from power converter 204. VCM loop 201 may adapt the output of comparator 232 to obtain the output voltage during equilibrium and load regulation. The one-cycle control ("OCC") loop 203 is described with respect to FIGS. 3-4.

Figure 3:
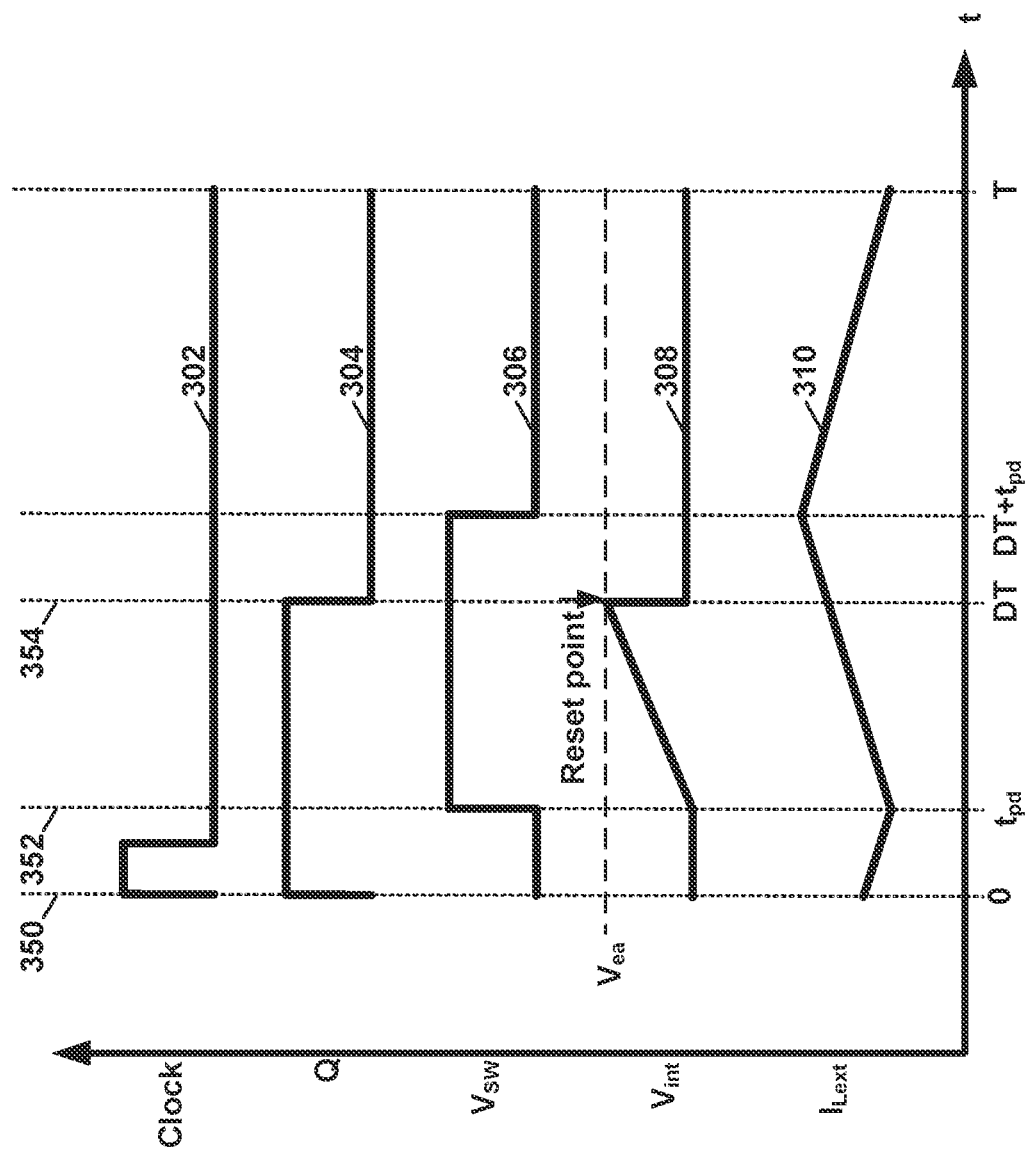
FIG. 3 is conceptual graph illustrating an example cycle of a switching signal based on a first clock signal, in accordance with one or more techniques of this disclosure.

FIG. 3 is conceptual graph illustrating an example cycle of a switching signal based on a first clock signal, in accordance with one or more techniques of this disclosure. FIG. 3 is discussed with respect to FIGS. 1-2 for example purposes only. The abscissa axis of FIG. 3 represents time (t) and the ordinate axis of FIG. 3 represents a first clock signal 302, an output (Q) 304 of SR flip-flop 231, a switch voltage ($V_{sw}$) 306 at switch 230, an integration voltage ($V_{int}$) 308 output by integrator 234, and an inductor current ($I_{Lext}$) 310 of an inductor ($L_{ext}$) of power converter 204.

At time 350, a switching cycle of power converter 204 (e.g., a Buck converter) is started by the rising edge of the first clock signal 302, postponed by a delay time $\Delta = t_{off,min}$, setting SR flip-flop 231 output Q 304 to '1'.

The input of integrator 234 is connected to SW-node $V_{SW}$ of FIG. 2, where the ramp at the integration voltage ($V_{int}$) 308 output by integrator 234 will start at time 352 after a propagation delay time $t_{pd}$, introduced by a gate-driver of power converter 204 which activates the high-side switch $Q_{HS}$ connecting SW-node $V_{SW}$ to supply input $V_{in}$. With the input of integrator 234 connected to supply input $V_{in}$ via switch $Q_{HS}$, the ramp at integration voltage ($V_{int}$) 308 output by integrator 234 may continue for the remainder of the on-time of $Q_{HS}$. At time 354 ("Reset point"), integration voltage ($V_{int}$) 308 output by integrator 234 has reached the reference level ($V_{ea}$), which comes from error-amplifier 236, and comparator 232 may reset the SR flip-flop 231 which may switch-off $Q_{HS}$ ending the on-time and reset integrator 234. From the end of on-time until the next rising edge of first clock signal 302, e.g. the off-time, inductor current 310 through $L_{ext}$ flows via low-side switch $D_{LS}$.

Figure 4:
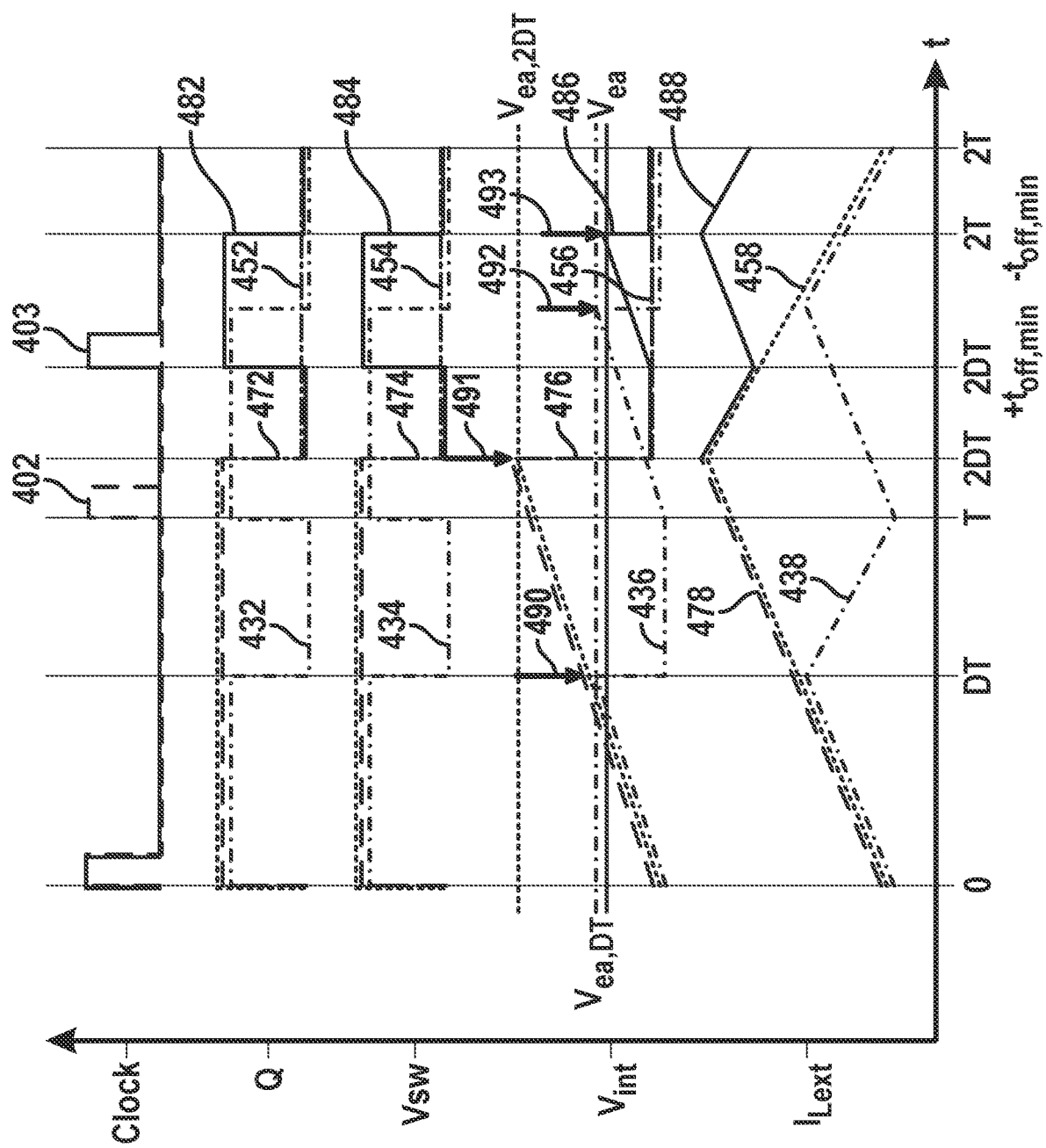
FIG. 4 is conceptual graph illustrating an example cycle of a switching signal based on a second clock signal, in accordance with one or more techniques of this disclosure.

FIG. 4 is conceptual graph illustrating an example cycle of a switching signal based on a second clock signal, in accordance with one or more techniques of this disclosure. FIG. 4 is discussed with respect to FIGS. 1-3 for example purposes only. The abscissa axis of FIG. 4 represents time (t) and the ordinate axis of FIG. 4 represents a first clock signal 402 and a second clock signal 403.

The ordinate axis of FIG. 4 further represents, for a first equilibrium, the output (Q) 432 of SR flip-flop 231, a switch voltage ($V_{sw}$) 434 at switch 230, an integration voltage ($V_{int}$) 436 output by integrator 234, and an inductor current ($I_{Lext}$) 438 of an inductor ($L_{ext}$) of power converter 204. While operating in the first equilibrium, system 200 may cause the integration voltage 436 to reset at reset points 490 and 492. The first equilibrium represents when a switching frequency of power converter 204 is equal to a clock-frequency of first clock signal 402 and when power converter 204 operates with a 60% duty-cycle assuming that power converter 204 receives an input voltage of 3 volts ($V_{in}$=3 V) and outputs an output voltage of 1.8 volts ($V_{out}$=1.8 V) with zero losses.

The ordinate axis of FIG. 4 further represents, for a second equilibrium, the output (Q) 452 of SR flip-flop 231, a switch voltage ($V_{sw}$) 454 at switch 230, an integration voltage ($V_{int}$) 456 output by integrator 234, and an inductor current ($I_{Lext}$) 458 of an inductor ($L_{ext}$) of power converter 204. While operating in the second equilibrium, system 200 may cause the integration voltage 456 to reset at reset point 491. The second equilibrium represents when the switching frequency of power converter 204 is half the clock-frequency of first clock signal 402 and when power converter 204 operates with a 60% duty-cycle. The second equilibrium is an example of an undesired equilibrium when power converter 204 receives an input voltage of 3 volts ($V_{in}$=3 V) and outputs an output voltage of 1.8 volts ($V_{out}$=1.8 V) with zero losses but with a reference voltage for comparator 232 stuck at double the intended reference value $V_{ea,2DT}$= $2 \cdot V_{ea,DT}$ such that integrator 234 uses double an amount of time to have the output level of integrator 234 reaching the reference level. The reference voltage for comparator 232 stuck at double the intended reference value may double the on-time to 2DT instead of DT, and therefore may also double the off-time in order to maintain the 60% Duty-Cycle. Power converter 204 may be stable in the undesired equilibrium, which may result in doubling an output ripple and a reduced voltage-headroom for the reference voltage $V_{ea}$ for comparator 232 compared to when operating at the desired equilibrium, which may reduce the dynamic range in duty-cycle regulation.

Further, the ordinate axis of FIG. 4 further represents, for a first cycle of a constant off-time switching mixed-mode, an output (Q) 472 of SR flip-flop 231, a switch voltage ($V_{SW}$) 474 at switch 230, an integration voltage ($V_{int}$) 476 output by integrator 234, and an inductor current ($I_{Lext}$) 478 of an inductor ($L_{ext}$) of power converter 204 and represents, for a second cycle of the constant off-time switching mixed-mode, an output (Q) 482 of SR flip-flop 231, a switch voltage ($V_{sw}$) 484 at switch 230, an integration voltage ($V_{int}$) 486 output by integrator 234, and an inductor current ($I_{Lext}$) 488 of an inductor ($L_{ext}$) of power converter 204. In the constant off-time switching mixed-mode, power converter 204 is operated with a first cycle having a greater than 60% duty cycle and an off-time equal to $t_{off,min}$. In the constant off-time switching mixed-mode, the constant off-time switching is forced when the on-time is more than $T_{SW}$-$t_{off,min}$, as shown with the first cycle having a greater than 60% duty cycle and off-time equal to $t_{off,min}$. While operating in the constant off-time switching mixed-mode, system 200 may cause the integration voltage 476 to reset at reset point 491 and may cause the integration voltage 486 to reset at reset point 493.

With the duty cycle during a cycle of greater than 60% being larger than the target duty cycle by system 200, the output voltage $V_{out}$ output by power converter 204 may increase. Error amplifier 236 may decrease the reference voltage $V_{ea}$ received by comparator 232 in response to the output voltage increasing. The second cycle having a 60% duty cycle with an off time equal to $t_{off,min}$ but a reduced reference for comparator 232 is denoted in FIG. 4 with '$V_{ea}$'. In some situations, a reduction of $V_{ea}$ within one clock cycle is, from a practical point of view, difficult or impossible due to the limited bandwidth of error amplifier 236, which may be too slow to accomplish such a sudden change at its output. But, as illustrated in FIG. 4 where the reference level '$V_{ea}$' for comparator 232 is a bit below the one indicated with '$V_{ea,DT}$', constant off-time switching with off-time=$t_{off,min}$ may force power converter 204 out of the undesired equilibrium back to the desired equilibrium.

More specifically, D flip-flop 222 may initiate constant off-time switching mode when the on-time exceeds switching period $T_{SW}$ minus minimum off-time $t_{off,min}$ (e.g. $T_{SW}$-$t_{off,min}$). For example, D flip-flop 222 may sample, at every clock cycle of first clock generator 212, output Q of SR flip-flop 231 for a rising edge and keeps power converter 204 operating in constant off-time switching mode by selecting an alternative clock source (e.g., second clock signal generator 224) for as long as D flip-flop 222 output Q remains '1'. Power converter 204 may act as free-running oscillator where the switching period of power converter 204 is equal to the actual on-time required plus minimum off-time: $t_{on,req}$+$t_{off,min}$. D flip-flop 222 may add $t_{off,min}$ to $t_{on,req}$ and provide the rising edge needed to start the next switching cycle. In some examples, constant off-time switching can be considered as operating in a Pulse frequency modulation (PFM) mode.

Techniques described herein for using error detection circuitry (e.g., D flip-flop 222) and a second clock signal generator (e.g., second clock signal generator 224) may help to force and keep the power converter operating in a constant off-time switching mode for as long as the system uses a switching frequency lower than the intended switching frequency. This mechanism may help to prevent clock frequency division while being stuck in an unintended equilibrium and may help to provide a smooth transition back to the intended equilibrium.

Figure 5:
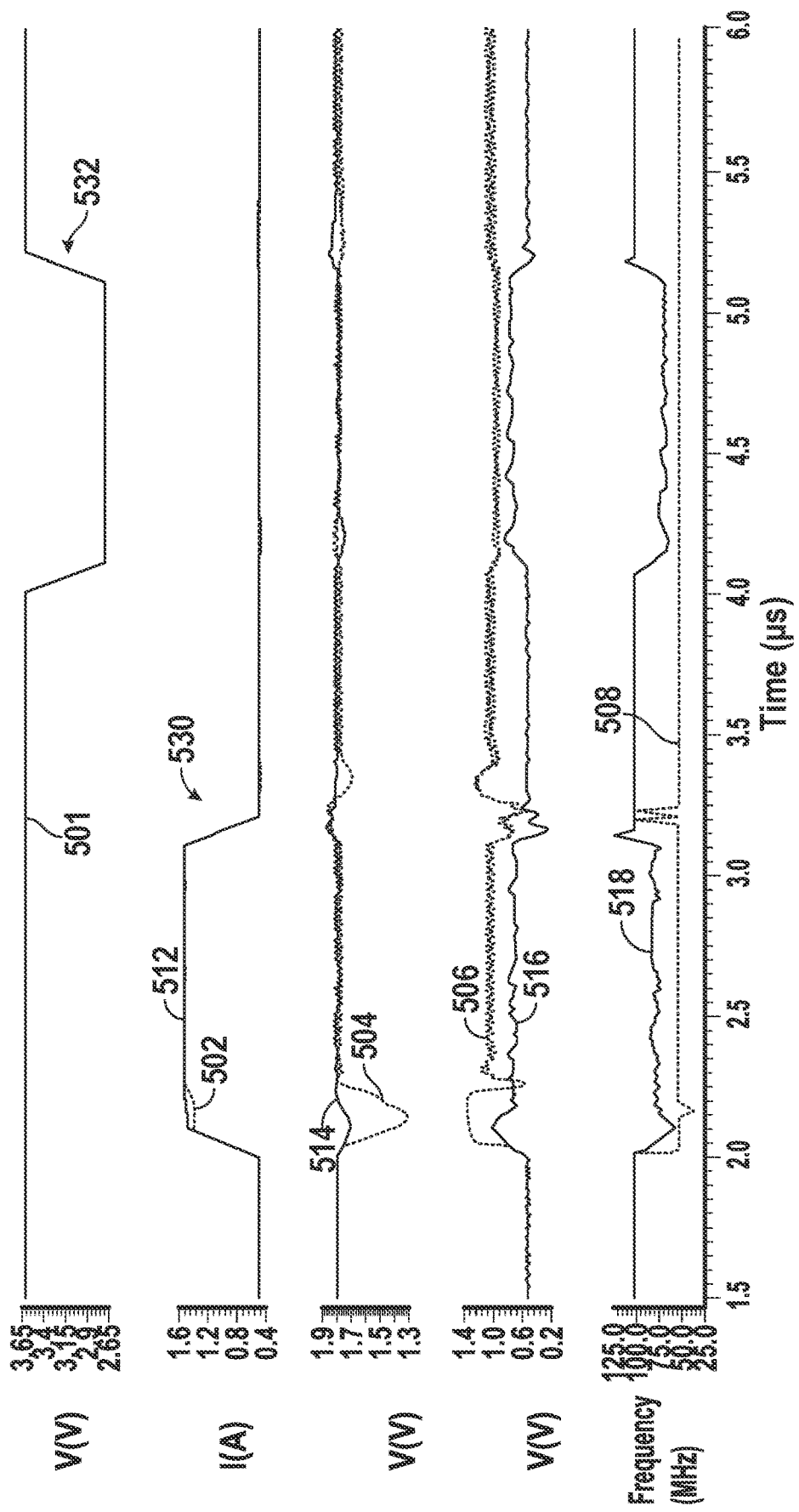
FIG. 5 is a conceptual graph illustrating a first example operation of a power converter controlled in accordance with one or more techniques of this disclosure.

FIG. 5 is a conceptual graph illustrating a first example operation of a power converter controlled in accordance with one or more techniques of this disclosure. FIG. 5 is discussed with respect to FIGS. 1-4 for example purposes only. The abscissa axis of FIG. 5 represents time (t) and the ordinate axis of FIG. 5 represents an input voltage 501 for power converter 104. The ordinate axis of FIG. 5 further represents, when switching signal generator 114 is configured to generate the switching signal only using a first clock signal generated by first clock signal generator 112, a current 502 output by power converter 104, an output voltage 504 output by power converter 104, the reference level '$V_{ea}$' 506 for comparator 232, and a switching frequency 508 of power converter 104.

In the example of FIG. 5, power converter 104 is assumed to include ideal switches with parasitic on-resistance ($R_{on,HS}$=671 mΩ, $R_{on,LS}$=310 mΩ), error amplifier 236 and comparator 232 are assumed to be transistor level, integrator 234 comprises an RC-filter, power converter 104 includes an external inductor $L_{ext}$ with 40 nH and an external capacitor $C_{ext}$ of 100 nF with an equivalent series resistance (ESR) of 10 mΩ, and first clock signal generator is configured to generate the first clock signal with a frequency of 100 MHz.

The example of FIG. 5 includes a load-step 530 from 0.5 A to 1.5 A starting at t=2.0 µs and ending at t=3.2 µs and a supply input step 532 from Vin=3.6 V to Vin=2.7 V starting at t=4.0 µs and ending at t=5.2 µs. As shown, the reference level '$V_{ea}$' 506 for comparator 232 does not return to the initial value (530 mV at t=1.5 µs) once the load step 530 has finished. Also, the supply input step 532, once finished, does not cause the regulator return to an initial state present at t=1.5 µs.

In accordance with techniques of the disclosure, system 100 may use error detection circuitry 122 and second clock signal generator 124 to help to bring power converter 104 back into the intended equilibrium of switching frequency. In the example of FIG. 5, the ordinate axis of FIG. 5 further represents, when using error detection circuitry 122 and second clock signal generator 124, a current 512 output by power converter 104, an output voltage 514 output by power converter 104, the reference level '$V_{ea}$' 516 for comparator 232, and a switching frequency 518 of power converter 104.

As shown in FIG. 5, the reference level '$V_{ea}$' 516 returns to the initial value (530 mV at t=1.5 µs) when load step 530 or supply input step 532 have finished. This behavior is also reflected in switching frequency 518. When only using first clock signal generator 112, switching frequency 508 does not return to the initial value (100 MHz at t=1.5 μs) once load step 530 or supply input step 532 have finished, but remains 'stuck' at 50 MHz, which is half the clock frequency. In contrast, when using error detection circuitry 122 and second clock signal generator 124, switching frequency 518 returns to the initial value (100 MHz at t=1.5 μs) when load step 530 or supply input step 532 have finished. As shown, during load step 530 or supply input step 532, switching frequency 518 may oscillate at about 70 MHz but returns to 100 MHz.

Figure 6:
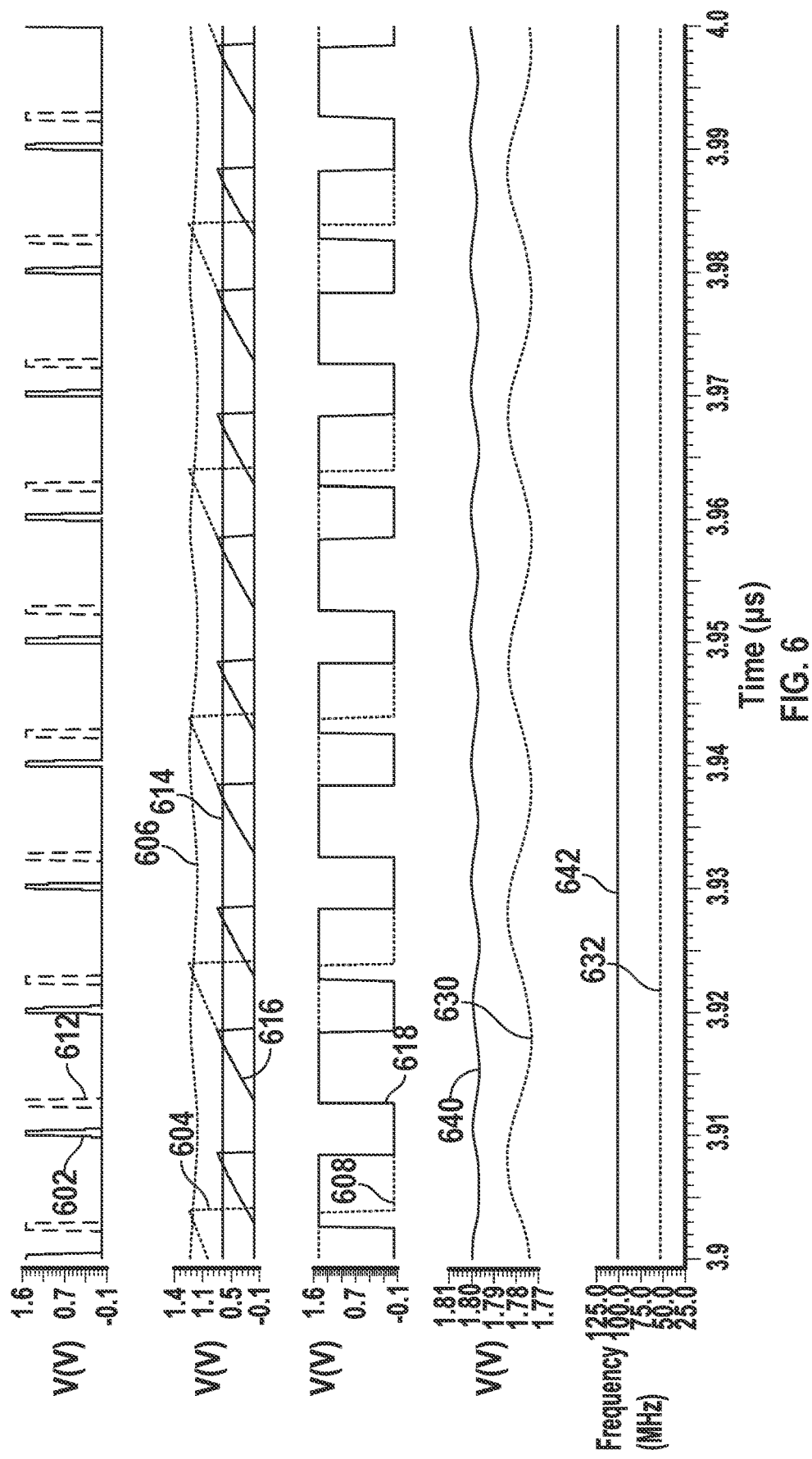
FIG. 6 is a conceptual graph illustrating a second example operation of a power converter controlled in accordance with one or more techniques of this disclosure.

FIG. 6 is a conceptual graph illustrating a second example operation of a power converter controlled in accordance with one or more techniques of this disclosure. FIG. 6 is discussed with respect to FIGS. 1-5 for example purposes only. The abscissa axis of FIG. 6 represents time (t) and the ordinate axis of FIG. 6 represents a first clock signal 602 and a second clock signal 612. The ordinate axis of FIG. 6 further represents, when switching signal generator 114 is configured to generate the switching signal only using first clock signal 602, integration voltage ($V_{int}$) 604 output by integrator 234, a reference level '$V_{ea}$' 606 for comparator 232, the output (Q) 608 of SR flip-flop 231, an output voltage 630 output by power converter 104, and a switching frequency 632 of power converter 104.

In the example of FIG. 6, reference level '$V_{ea}$' 606 for comparator 232 is about 1.05 V, which is about double the value compared to the initial 530 mV. Additionally, switching frequency 632 has dropped to 50 MHz (which is half the clock frequency). The duty-cycle in the unintended equilibrium of when switching signal generator 114 is configured to generate the switching signal only using first clock signal 602 is 56.7%.

The ordinate axis of FIG. 6 further represents, when switching signal generator 114 is configured to generate the switching signal using first clock signal 602, error detection circuitry 122, and second clock signal generator 124, integration voltage ($V_{int}$) 614 output by integrator 234, a reference level '$V_{ea}$' 616 for comparator 232, the output (Q) 618 of SR flip-flop 231, an output voltage 640 output by power converter 104, and a switching frequency 642 of power converter 104. In the example of FIG. 6, reference level '$V_{ea}$' 616 for comparator 232 is about 530 mV, which corresponds to the initial 530 mV. Additionally, switching frequency 642 is 100 MHz, which corresponds to the clock frequency. The duty-cycle in the intended equilibrium is 57.6%.

For both the unintended equilibrium and the intended equilibrium, the difference in value of duty-cycle is within 1%, from which can be concluded that despite the difference of equilibrium, the unintended equilibrium and the intended equilibrium both lead to the same stable input-to-output DC-DC conversion.

Figure 7:
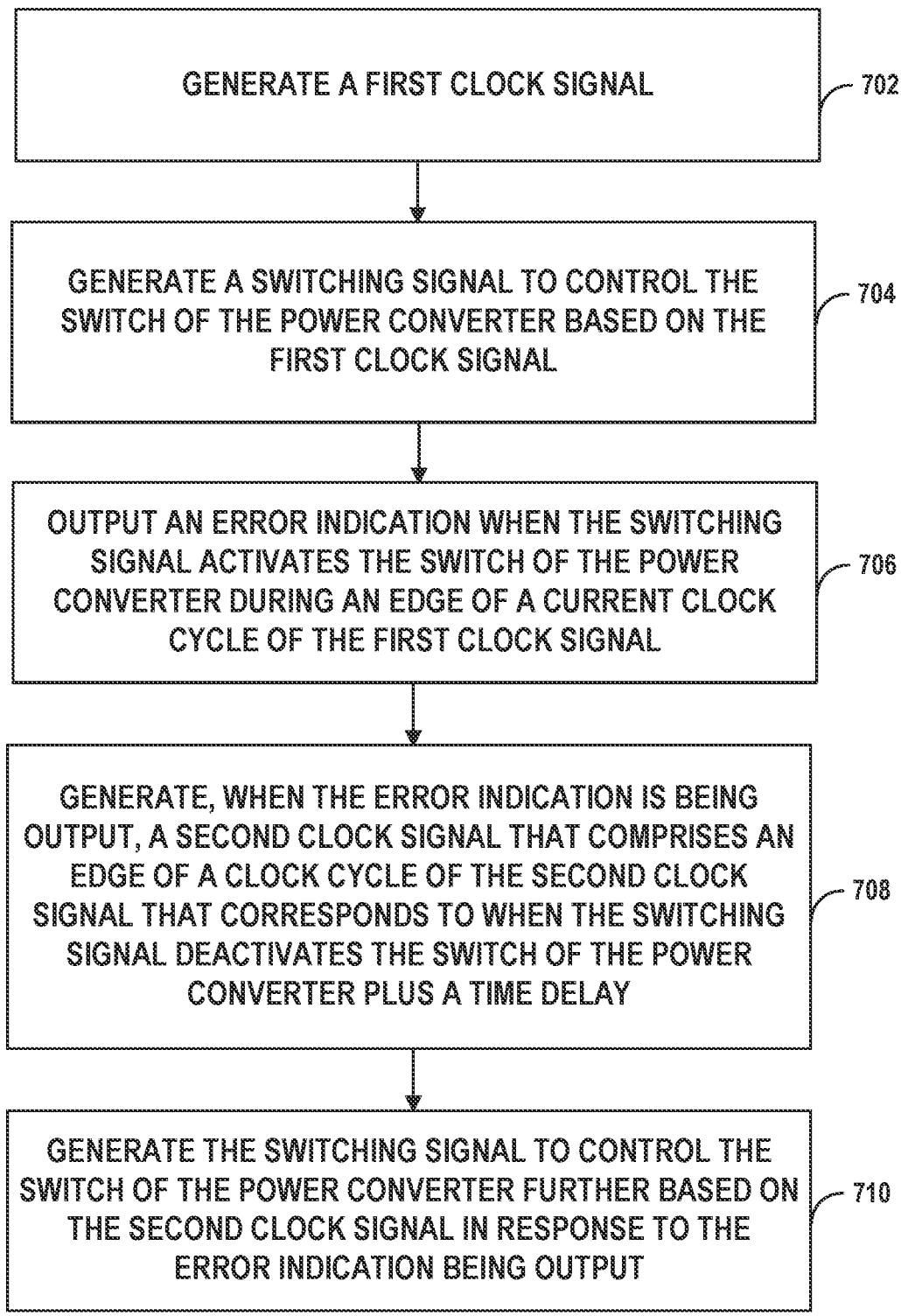
FIG. 7 is a flow diagram consistent with techniques that may be performed by the example system of FIG. 1, in accordance with this disclosure.

FIG. 7 is a flow diagram consistent with techniques that may be performed by the example system of FIG. 1, in accordance with this disclosure. FIG. 7 is described with FIGS. 1-6 for example purposes only.

In accordance with the techniques of the disclosure, first clock signal generator 112 may generate a first clock signal (702). For example, first clock signal generator 112 may generate the first clock signal to include a synchronous clock signal (e.g., 100 MHz). Switching signal generator 114 may generate a switching signal to control switch 130 of power converter 104 based on the first clock signal (704). For instance, switching signal generator 114 may generate the switching signal using the first clock signal when multiplexer 244 is configured to output the indication of the setting state event (e.g., output by AND gate 242).

Error detection circuitry 122 may output an error indication in response to the switching signal activating switch 130 of power converter 104 during an edge (e.g., a rising edge or a falling edge) of a current clock cycle of the first clock signal (706). For example, D flip-flop 222 may sample, at every clock cycle of first clock generator 212, output Q of SR flip-flop 231 for an edge (e.g., a rising edge) and keeps power converter 204 operating in constant off-time switching mode by selecting an alternative clock source (e.g., second clock signal generator 224) for as long as D flip-flop 222 output Q remains '1'. In some examples, constant off-time switching can be considered as operating in a Pulse Frequency Modulation (PFM) mode.

In this way, error detection circuitry 122 may output the error indication in response to switch 130 getting "stuck" in a switched-in state. The error detection circuitry 122 may output the error indication in response to an unintended equilibrium of switching frequency being, for example, half of an intended switching frequency due to a comparator reference being double than intended. When operating in the unintended equilibrium of switching frequency, the driver circuit may generate a switching signal with a regulator on-time and off-time being double the intended on-time and off-time, respectively, as well maintaining the intended duty-cycle.

Second clock signal generator 124 may generate, in response to the error indication being output by error detection circuitry 122, a second clock signal that comprises an edge (e.g., a rising edge or a falling edge) of a clock cycle of the second clock signal that corresponds to when the switching signal deactivates switch 130 of power converter 104 plus a time delay (708). For example, second clock signal 403 includes a rising edge that corresponds to when output (Q) 472 deactivates switch 230 (e.g., 2DT) plus a time delay ($t_{off,min}$ and/or a programmable time delay).

Switching signal generator 114 may generate the switching signal to control switch 130 of power converter 104 further based on the second clock signal in response to the error indication being output by the error detection circuitry 122 (710). For example, switching signal generator 114 may generate (Q) 482 to activates switch 230 at the rising edge of second clock signal 403. In this way, switching signal generator 114 may generate the switching signal to help to force and keep power converter 104 operating in a constant off-time switching mode for as long as system 100 uses a switching frequency lower than the intended switching frequency.

The following examples may illustrate one or more aspects of the disclosure.

Clause 1: A circuit for controlling a switch of a power converter, the circuit comprising: a first clock signal generator configured to generate a first clock signal; a switching signal generator configured to generate a switching signal to control the switch of the power converter based on the first clock signal; error detection circuitry configured to output an error indication in response to the switching signal activating the switch of the power converter during an edge of a current clock cycle of the first clock signal; a second clock signal generator configured to generate, in response to the error indication being output by the error detection circuitry, a second clock signal that comprises an edge of a clock cycle of the second clock signal that corresponds to when the switching signal deactivates the switch of the power converter plus a time delay; and wherein the switching signal generator is configured to generate the switching signal to control the switch of the power converter further based on the second clock signal in response to the error indication being output by the error detection circuitry.

Clause 1. The circuit of clause 1, wherein the time delay corresponds to a minimum off time for the switch.

Clause 2. The circuit of any of clauses 1-2, wherein the time delay is programmable.

Clause 3. The circuit of any of clauses 1-3, wherein the time delay is greater than the minimum off time for the switch.

Clause 4. The circuit of any of clauses 1-4, wherein the first clock signal comprises a synchronous clock signal; and wherein the second clock signal comprises an asynchronous clock signal.

Clause 5. The circuit of any of clauses 1-5, wherein the edge of the current clock cycle of the first clock signal comprises a rising edge.

Clause 6. The circuit of any of clauses 1-6, wherein the error detection circuit comprises a delay (D) flip-flop comprising: a delay input configured to receive the switching signal; a clock input configured to receive the first clock signal; and an output configured to output the error indication.

Clause 7. The circuit of any of clauses 1-7, wherein the second clock signal generator comprises a delay (D) flip-flop comprising: a delay input configured to receive the error indication; a clock input configured to receive an inverted signal of the switching signal delayed by the time delay; and an output configured to output the second clock signal.

Clause 8. The circuit of any of clauses 1-8, wherein the switching signal generator comprises a set-reset (SR) flip-flop comprising: a set (S) input configured to receive the second clock signal when the error detection circuitry outputs the error indication and to receive, when the error detection circuitry does not output the error indication, an indication of a setting state event, wherein the setting state is based on an AND operation on the first clock signal delayed by the time delay and an inverted signal of the switching signal delayed by the time delay; a reset (R) input configured to receive an indication of whether to reset the switching signal that is based on a comparison of an indication of an integration of a switching voltage output at the switch of the power converter and an indication of a difference between a voltage output by the power converter and a reference voltage; and an output (Q) configured to output the switching signal.

Clause 9. The circuit of clause 9, wherein the switching signal generator further comprises a multiplexer that includes: a first input configured to receive the second clock signal; a second input configured to receive the indication of the setting state event; and a select line input configured to receive the error indication.

Clause 10. The circuit of any of clauses 9-10, wherein the switching signal generator further comprises a comparator that includes: a first input configured to receive the indication of the integration of the switching voltage; a second input configured to receive the indication of the difference between the voltage output by the power converter and the reference voltage; and an output configured to output the indication of whether to reset the switching signal based on the comparison of the indication of the integration of the switching voltage and the indication of the difference between the voltage output by the power converter and the reference voltage.

Clause 11. The circuit of any of clauses 9-11, wherein the switching signal generator further comprises an error amplifier that includes: a first input configured to receive the indication of the voltage output by the power converter; a second input configured to receive the reference voltage; and an output configured to output the indication of the difference between the voltage output by the power converter and the reference voltage.

Clause 12. The circuit of any of clauses 9-11, wherein the switching signal generator further comprises an integrator that includes: an input configured to receive an indication of a switching voltage output at the switch of the power converter; a reset input configured to receive the inverted signal of the switching signal; and an output configured to output the indication of the integration of the switching voltage.

Clause 13. The circuit of any of clauses 1-13, further comprising a driver configured to drive the switch of the power converter based on the switching signal.

Clause 14. The circuit of any of clauses 1-14, wherein the power converter comprises a buck converter.

Clause 15. A method for controlling a switch of a power converter, the method comprising: generating a first clock signal; generating a switching signal to control the switch of the power converter based on the first clock signal; outputting an error indication when the switching signal activates the switch of the power converter during an edge of a current clock cycle of the first clock signal; generating, when the error indication is being output, a second clock signal that comprises an edge of a clock cycle of the second clock signal that corresponds to when the switching signal deactivates the switch of the power converter plus a time delay; and generating the switching signal to control the switch of the power converter further based on the second clock signal in response to the error indication being output.

Clause 16. The method of clause 16, wherein the time delay corresponds to a minimum off time for the switch.

Clause 17. The method of any of clauses 16-17, wherein the time delay is programmable.

Clause 18. The method of any of clauses 16-18, wherein the time delay is greater than the minimum off time for the switch.

Clause 19. A system comprising: a power converter; and driver circuitry comprising: a first clock signal generator configured to generate a first clock signal; a switching signal generator configured to generate a switching signal to control a switch of the power converter based on the first clock signal; error detection circuitry configured to output an error indication in response to the switching signal activating the switch of the power converter during an edge of a current clock cycle of the first clock signal; a second clock signal generator configured to generate, in response to the error indication being output by the error detection circuitry, a second clock signal that comprises an edge of a clock cycle of the second clock signal that corresponds to when the switching signal deactivates the switch of the power converter plus a time delay; and wherein the switching signal generator is configured to generate the switching signal to control the switch of the power converter further based on the second clock signal in response to the error indication being output by the error detection circuitry.

Various aspects have been described in this disclosure. These and other aspects are within the scope of the following claims.

What is claimed is:
1. A circuit for controlling a switch of a power converter, the circuit comprising:
a first clock signal generator configured to generate a first clock signal;

a switching signal generator configured to generate a switching signal to control the switch of the power converter based on the first clock signal;

error detection circuitry configured to output an error indication in response to the switching signal activating the switch of the power converter during an edge of a current clock cycle of the first clock signal;

a second clock signal generator configured to generate, in response to the error indication being output by the error detection circuitry, a second clock signal that comprises an edge of a clock cycle of the second clock signal that corresponds to when the switching signal deactivates the switch of the power converter plus a time delay; and wherein the switching signal generator is configured to generate the switching signal to control the switch of the power converter further based on the second clock signal in response to the error indication being output by the error detection circuitry.

2. The circuit of claim 1, wherein the time delay corresponds to a minimum off time for the switch.

3. The circuit of claim 1, wherein the time delay is programmable.

4. The circuit of claim 1, wherein the time delay is greater than the minimum off time for the switch.

5. The circuit of claim 1,
wherein the first clock signal comprises a synchronous clock signal; and
wherein the second clock signal comprises an asynchronous clock signal.

6. The circuit of claim 1, wherein the edge of the current clock cycle of the first clock signal comprises a rising edge.

7. The circuit of claim 1, wherein the error detection circuit comprises a delay (D) flip-flop comprising:
a delay input configured to receive the switching signal;
a clock input configured to receive the first clock signal; and
an output configured to output the error indication.

8. The circuit of claim 1, wherein the second clock signal generator comprises a delay (D) flip-flop comprising:
a delay input configured to receive the error indication;
a clock input configured to receive an inverted signal of the switching signal delayed by the time delay; and
an output configured to output the second clock signal.

9. The circuit of claim 1, wherein the switching signal generator comprises a set-reset (SR) flip-flop comprising:
a set (S) input configured to receive the second clock signal when the error detection circuitry outputs the error indication and to receive, when the error detection circuitry does not output the error indication, an indication of a setting state event, wherein the setting state is based on an AND operation on the first clock signal delayed by the time delay and an inverted signal of the switching signal delayed by the time delay;
a reset (R) input configured to receive an indication of whether to reset the switching signal that is based on a comparison of an indication of an integration of a switching voltage output at the switch of the power converter and an indication of a difference between a voltage output by the power converter and a reference voltage; and
an output (Q) configured to output the switching signal.

10. The circuit of claim 9, wherein the switching signal generator further comprises a multiplexer that includes:
a first input configured to receive the second clock signal;
a second input configured to receive the indication of the setting state event; and
a select line input configured to receive the error indication.

11. The circuit of claim 9, wherein the switching signal generator further comprises a comparator that includes:
a first input configured to receive the indication of the integration of the switching voltage;
a second input configured to receive the indication of the difference between the voltage output by the power converter and the reference voltage; and
an output configured to output the indication of whether to reset the switching signal based on the comparison of the indication of the integration of the switching voltage and the indication of the difference between the voltage output by the power converter and the reference voltage.

12. The circuit of claim 9, wherein the switching signal generator further comprises an error amplifier that includes:
a first input configured to receive the indication of the voltage output by the power converter;
a second input configured to receive the reference voltage; and
an output configured to output the indication of the difference between the voltage output by the power converter and the reference voltage.

13. The circuit of claim 9, wherein the switching signal generator further comprises an integrator that includes:
an input configured to receive an indication of a switching voltage output at the switch of the power converter;
a reset input configured to receive the inverted signal of the switching signal; and
an output configured to output the indication of the integration of the switching voltage.

14. The circuit of claim 1, further comprising a driver configured to drive the switch of the power converter based on the switching signal.

15. The circuit of claim 1, wherein the power converter comprises a buck converter.

16. A method for controlling a switch of a power converter, the method comprising:
generating a first clock signal;
generating a switching signal to control the switch of the power converter based on the first clock signal;
outputting an error indication when the switching signal activates the switch of the power converter during an edge of a current clock cycle of the first clock signal;
generating, when the error indication is being output, a second clock signal that comprises an edge of a clock cycle of the second clock signal that corresponds to when the switching signal deactivates the switch of the power converter plus a time delay; and
generating the switching signal to control the switch of the power converter further based on the second clock signal in response to the error indication being output.

17. The method of claim 16, wherein the time delay corresponds to a minimum off time for the switch.

18. The method of claim 16, wherein the time delay is programmable.

19. The method of claim 16, wherein the time delay is greater than the minimum off time for the switch.

20. A system comprising:
a power converter; and
driver circuitry comprising:
a first clock signal generator configured to generate a first clock signal;
a switching signal generator configured to generate a switching signal to control a switch of the power converter based on the first clock signal;

error detection circuitry configured to output an error indication in response to the switching signal activating the switch of the power converter during an edge of a current clock cycle of the first clock signal;
a second clock signal generator configured to generate, in response to the error indication being output by the error detection circuitry, a second clock signal that comprises an edge of a clock cycle of the second clock signal that corresponds to when the switching signal deactivates the switch of the power converter plus a time delay; and
wherein the switching signal generator is configured to generate the switching signal to control the switch of the power converter further based on the second clock signal in response to the error indication being output by the error detection circuitry.

* * * * *